(12) United States Patent  (10) Patent No.:  US 10,916,452 B2
Tsai et al.  (45) Date of Patent:  Feb. 9, 2021

(54) WAFER DRYING EQUIPMENT AND METHOD THEREOF

(71) Applicant: NANYA TECHNOLOGY CORPORATION, New Taipei (TW)

(72) Inventors: Feng-Ju Tsai, Hsinchu County (TW); Shyue-Ru Doong, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 16 days.

(21) Appl. No.: 16/232,039

(22) Filed: Dec. 25, 2018

(65) Prior Publication Data

US 2020/0176277 A1  Jun. 4, 2020

Related U.S. Application Data

(60) Provisional application No. 62/775,363, filed on Dec. 4, 2018.

(51) Int. Cl.
*H01L 21/67* (2006.01)
*F26B 3/347* (2006.01)

(52) U.S. Cl.
CPC ........ *H01L 21/67034* (2013.01); *F26B 3/347* (2013.01); *H01L 21/67115* (2013.01)

(58) Field of Classification Search
CPC .... F26B 3/347; F26B 3/00; F26B 9/00; F26B 21/00; F26B 21/06; H01L 21/67034; H01L 21/67115
USPC .......................................................... 34/259
See application file for complete search history.

(56) References Cited

U.S. PATENT DOCUMENTS

| | | | | |
|---|---|---|---|---|
| 5,458,687 A * | 10/1995 | Shichida | ............. | C23C 16/4586 118/724 |
| 5,928,426 A * | 7/1999 | Aitchison | ............ | B01D 53/005 118/715 |
| 5,953,827 A * | 9/1999 | Or | ..................... | H01L 21/67098 34/58 |
| 6,152,070 A * | 11/2000 | Fairbairn | .......... | H01L 21/67201 118/719 |
| 6,221,167 B1 * | 4/2001 | Karasawa | ................. | B08B 3/10 134/1 |
| 6,598,314 B1 * | 7/2003 | Kuo | .................. | H01L 21/67034 34/265 |
| 6,930,041 B2 * | 8/2005 | Agarwal | ............... | C23C 16/452 438/660 |
| 7,181,863 B2 * | 2/2007 | Ferrell | ............. | H01L 21/67034 34/340 |
| 7,585,686 B2 * | 9/2009 | Verhaverbeke | ..... | H01L 21/6719 438/16 |

(Continued)

FOREIGN PATENT DOCUMENTS

DE  102008036766 B4 *  8/2013  ............... C23C 8/36
EP  2311066 B1 *  11/2013  ........ H01J 37/32211
(Continued)

*Primary Examiner* — Stephen M Gravini
(74) *Attorney, Agent, or Firm* — CKC & Partners Co., LLC

(57) ABSTRACT

A wafer drying equipment includes a base, a casing and a microwave generator. The base is configured to support a wafer. The casing forms a chamber with the base. The chamber is configured to accommodate the wafer. The casing has an exhaust vent away from the base. The microwave generator is disposed on the casing and is configured to emit a microwave to the chamber.

7 Claims, 3 Drawing Sheets

(56) References Cited

U.S. PATENT DOCUMENTS

| | | | | |
|---|---|---|---|---|
| 8,716,153 | B2 * | 5/2014 | Lerch | C23C 8/36 |
| | | | | 156/345.41 |
| 8,765,000 | B2 * | 7/2014 | Palsulich | H01L 21/67086 |
| | | | | 216/94 |
| 9,658,106 | B2 * | 5/2017 | Kobayashi | H01L 21/67253 |
| 9,867,269 | B2 * | 1/2018 | Ruzic | H01L 31/18 |

FOREIGN PATENT DOCUMENTS

| | | | | |
|---|---|---|---|---|
| JP | 5738762 B2 * | 6/2015 | | C23C 8/36 |
| KR | 20110110087 A * | 10/2011 | | C23C 8/36 |
| TW | 200737290 A | 10/2007 | | |
| WO | WO-2010015385 A1 * | 2/2010 | | H01J 37/32211 |

\* cited by examiner

WAFER DRYING EQUIPMENT AND METHOD THEREOF

CROSS-REFERENCE TO RELATED APPLICATION

This application claims priority to U.S. Provisional Application Ser. No. 62/775,363, filed Dec. 4, 2018, the disclosures of which are incorporated herein by reference in their entireties.

BACKGROUND

Technical Field

The present disclosure relates to wafer drying equipment.

Description of Related Art

In the semiconductor industry, a wide variety of manufacturing and testing processes are involved. In some processes, chemical treatment is involved in which chemical solution contacts and reacts with the wafers.

Following the rinsing treatment by deionized water (DIW) to the wafers after the chemical treatment, the wafers should be made dry first to avoid damage of the wafers and to maintain the performing accuracy in the subsequent processes.

SUMMARY

A technical aspect of the present disclosure is to provide a wafer drying equipment, which can simplify the drying process for the wafer and effectively reduce the operating cost.

According to an embodiment of the present disclosure, a wafer drying equipment includes a base, a casing and a microwave generator. The base is configured to support a wafer. The casing forms a chamber with the base. The chamber is configured to accommodate the wafer. The casing has an exhaust vent away from the base. The microwave generator is disposed on the casing and is configured to emit a microwave to the chamber.

In one or more embodiments of the present disclosure, the microwave generator is disposed outside the casing. The casing has a plurality of through holes. The through holes are configured to allow the microwave to penetrate through.

In one or more embodiments of the present disclosure, a quantity of the microwave generator is plural and the microwave generators are distributed around the chamber.

In one or more embodiments of the present disclosure, the wafer drying equipment further includes a rotator. The rotator is connected with the base and is configured to rotate the base.

In one or more embodiments of the present disclosure, a rotating speed of the base is about 10 rpm.

In one or more embodiments of the present disclosure, the casing is made of metal.

In one or more embodiments of the present disclosure, the exhaust vent is in a form of plurality of through holes.

According to another embodiment of the present disclosure, a method for drying a wafer is provided. The method includes holding the wafer in a chamber; emitting a microwave to the wafer to heat up a water on the wafer to become a steam; and discharging the steam away from the chamber.

In one or more embodiments of the present disclosure, the method includes rotating the wafer.

In one or more embodiments of the present disclosure, a rotating speed of the wafer is about 10 rpm.

When compared with the prior art, the above-mentioned embodiments of the present disclosure have at least the following advantages:

(1) By the application of microwave to remove the water remained on the surface of the wafer from previous manufacturing process, the drying process is made simple and the operating cost to dry the wafer is thus effectively reduced.

(2) Since the microwave generators are evenly distributed around the chamber, the microwave reaching the chamber and thus the wafer located in the chamber can be in an even manner, facilitating the drying process of the wafer.

(3) Since the wafer is rotated at a low speed of about 10 rpm, the wafer can be evenly exposed to the microwave emitted from the microwave generators, and the drying process of the wafer can be facilitated.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
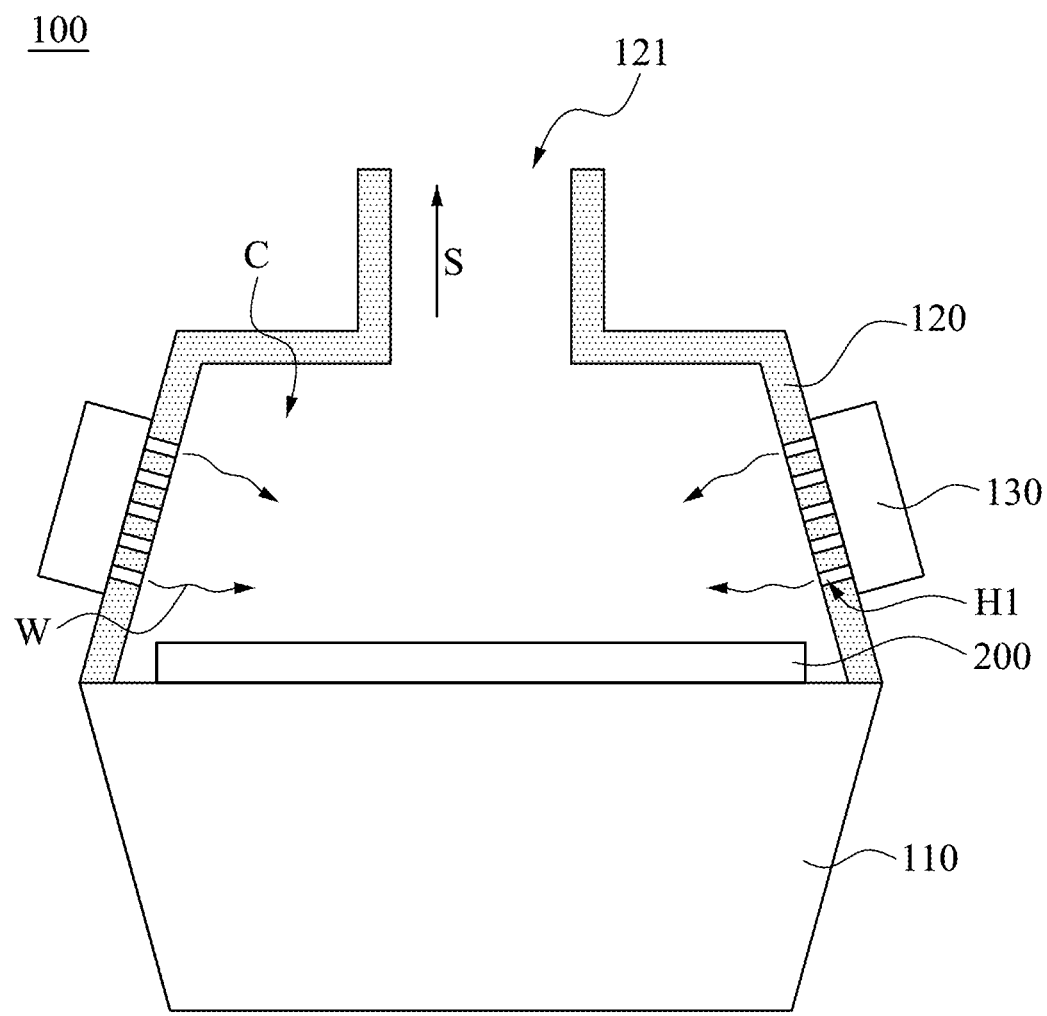
FIG. 1 is a sectional view of a wafer drying equipment according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a sectional view of a wafer drying equipment 100 according to an embodiment of the present disclosure. In this embodiment, as shown in FIG. 1, a wafer drying equipment 100 includes a base 110, a casing 120 and a microwave generator 130. The base 110 is configured to support a wafer 200. The casing 120 is made of metal and forms a chamber C with the base 110. In practice, the casing 120 is in contact with the base 110. According to actual situations, the contact between the casing 120 and the base 110 can be sealed. However, this does not intend to limit the present disclosure. The chamber C formed by the casing 120 and the base 110 is configured to accommodate the wafer 200. The casing 120 has an exhaust vent 121. The exhaust vent 121 is located away from the base 110. The microwave generator 130 is disposed on the casing 120. Moreover, the microwave generator 130 is configured to emit a microwave W to the chamber C where the wafer 200 is located.

During the operation of the wafer drying equipment 100, the wafer 200 is first held by the base 110 such that the wafer 200 is located in the chamber C formed by the casing 120 and the base 110. Afterwards, the microwave generator 130 emits a microwave W to the wafer 200 located in the chamber C, such that the water (not shown) remained on the surface of the wafer 200 from previous manufacturing process receives the microwave W from the microwave generator 130. In this way, the water on the surface of the wafer 200 is heated up to become steam S. The steam S is then discharged away from the chamber C through the exhaust vent 121 of the casing 120. Therefore, the water on the surface of the wafer 200 is removed and the wafer 200 is made dry.

By the application of microwave W to remove the water remained on the surface of the wafer 200 from previous manufacturing process, the drying process is made simple and the operating cost to dry the wafer 200 is thus effectively reduced.

Furthermore, as shown in FIG. 1, the microwave generator 130 is disposed outside the casing 120. The casing 120 has a plurality of through holes H1. Practically, the through holes H1 are configured to allow the microwave W to penetrate through, such that the microwave W emitted from the microwave generator 130 is able to reach the chamber C and thus the wafer 200 located in the chamber C.

In practical applications, the quantity of the microwave generator 130 is plural. In general, the microwave generators 130 are evenly distributed around the chamber C. In this way, the microwave W reaching the chamber C and thus the wafer 200 located in the chamber C can be in an even manner, facilitating the drying process of the wafer 200. For example, as shown in FIG. 1, at least two numbers of microwave generators 130 are evenly distributed outside the casing 120 and thus around the chamber C.

Moreover, it is worth to note that, the casing 120 in the present disclosure can be disposed practically on an existing single wafer wet equipment (not shown) of the industry. In general, the single wafer wet equipment has a rotating base. The rotating base is used to hold a single piece of wafer for various treatments in the single wafer wet equipment. After a wafer is treated by the single wafer wet equipment, the wafer can be remained on the rotating base while the casing 120 disposed with the microwave generator 130 in the present disclosure can be disposed on the rotating base of the single wafer wet equipment, and the process to dry the wafer as mentioned as above can be carried out.

Figure 2:
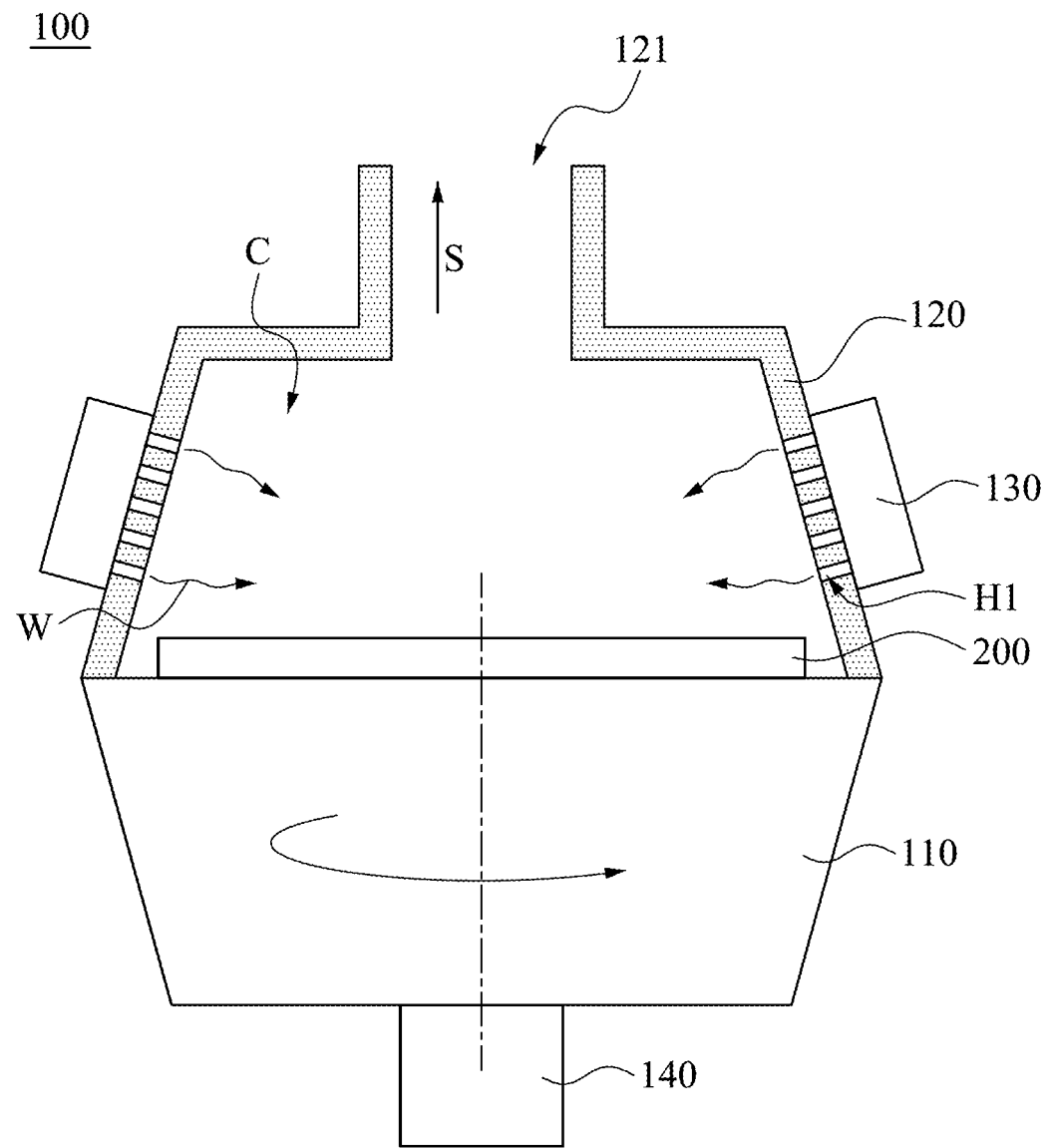
FIG. 2 is a sectional view of a wafer drying equipment according to another embodiment of the present disclosure.

Reference is made to FIG. 2. FIG. 2 is a sectional view of a wafer drying equipment 100 according to another embodiment of the present disclosure. In this embodiment, as shown in FIG. 2, the wafer drying equipment 100 further includes a rotator 140. The rotator 140 is connected with the base 110. Moreover, the rotator 140 is configured to rotate the base 110. During the operation of drying process to the wafer 200 by the wafer drying equipment 100, the base 100 is rotated by the rotator 140. In practice, for instance, the rotating speed of the base 110 is about 10 rpm. This means, the wafer 200 is also rotated at a low speed of about 10 rpm. In this way, the wafer 200 can be evenly exposed to the microwave W emitted from the microwave generators 130, and the drying process of the wafer 200 can be further facilitated.

In practical applications, the application of rotator 140 to the base 110 can be also referred as the rotating base in an existing single wafer wet equipment as mentioned above.

Figure 3:
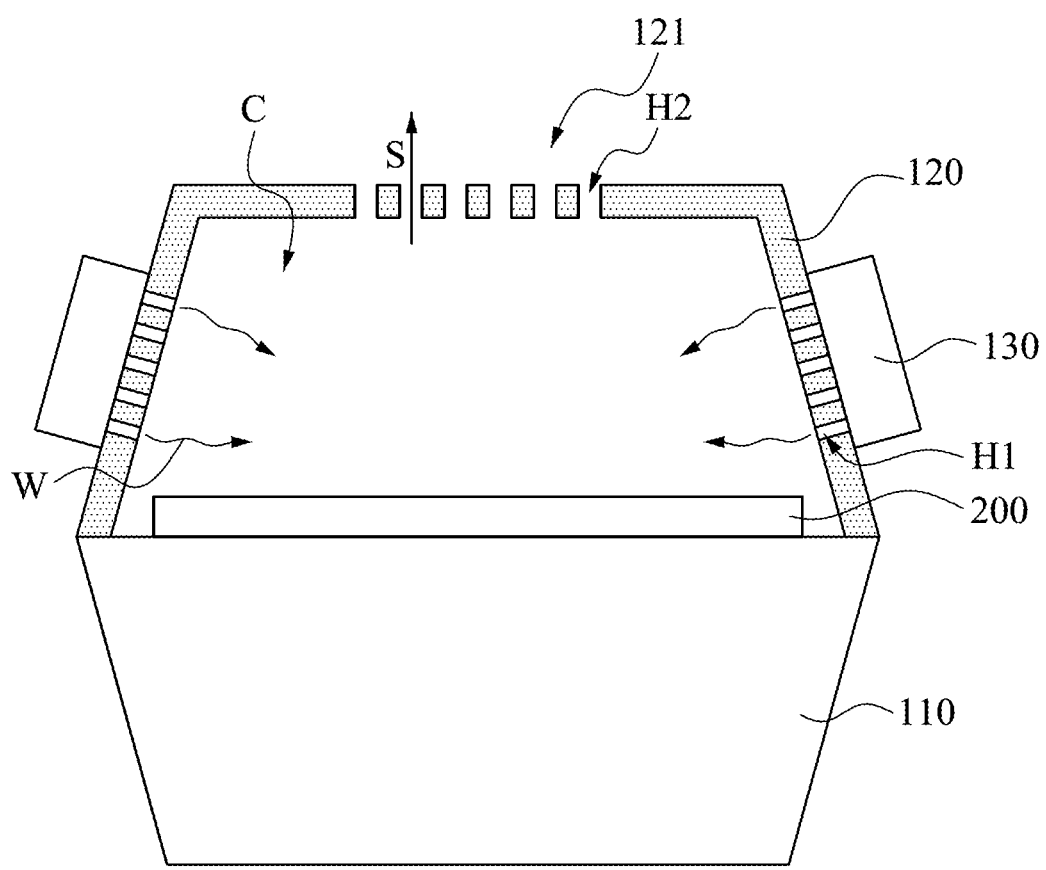
FIG. 3 is a sectional view of a wafer drying equipment according to a further embodiment of the present disclosure.

Reference is made to FIG. 3. FIG. 3 is a sectional view of a wafer drying equipment 100 according to a further embodiment of the present disclosure. In this embodiment, as shown in FIG. 3, the exhaust vent 121 of the casing 120 is in a form of plurality of through holes H2. In this way, the steam S formed from the water originally on the surface of the wafer 200 can be discharged through the through holes H2. Thus, a flexible design for the casing 120 is provided according to actual situations.

In conclusion, when compared with the prior art, the aforementioned embodiments of the present disclosure have at least the following advantages:

(1) By the application of microwave to remove the water remained on the surface of the wafer from previous manufacturing process, the drying process is made simple and the operating cost to dry the wafer is thus effectively reduced.

(2) Since the microwave generators are evenly distributed around the chamber, the microwave reaching the chamber and thus the wafer located in the chamber can be in an even manner, facilitating the drying process of the wafer.

(3) Since the wafer is rotated at a low speed of about 10 rpm, the wafer can be evenly exposed to the microwave emitted from the microwave generators, and the drying process of the wafer can be facilitated.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A wafer drying equipment, comprising:
   a base configured to support a wafer;
   a casing forming a chamber with the base, the chamber being configured to accommodate the wafer, the casing having an exhaust vent away from the base; and
   a microwave generator disposed in direct contact with an outer surface of the casing and configured to emit a microwave to the wafer in the chamber.

2. The wafer drying equipment of claim 1, wherein the microwave generator is disposed outside the casing and the casing has a plurality of through holes configured to allow the microwave to penetrate through.

3. The wafer drying equipment of claim 1, wherein a quantity of the microwave generator is plural and the microwave generators are distributed around the chamber.

4. The wafer drying equipment of claim 1, further comprising:
   a rotator connected with the base and configured to rotate the base.

5. The wafer drying equipment of claim 4, wherein a rotating speed of the base is about 10 rpm.

6. The wafer drying equipment of claim 1, wherein the casing is made of metal.

7. The wafer drying equipment of claim 1, wherein the exhaust vent is in a form of plurality of through holes.

* * * * *